(12) United States Patent
Lu et al.

(10) Patent No.: US 12,218,301 B2
(45) Date of Patent: Feb. 4, 2025

(54) MANUFACTURING METHOD OF ELECTRONIC DEVICE

(71) Applicant: AUO Corporation, Hsinchu (TW)

(72) Inventors: Chih-Wen Lu, Hsinchu (TW); Hao-An Chuang, Hsinchu (TW); Chun-Yueh Hou, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/413,033

(22) Filed: Jan. 16, 2024

(65) Prior Publication Data

US 2024/0154078 A1 May 9, 2024

Related U.S. Application Data

(62) Division of application No. 17/376,189, filed on Jul. 15, 2021, now Pat. No. 11,923,491.

(60) Provisional application No. 63/065,641, filed on Aug. 14, 2020.

(30) Foreign Application Priority Data

Feb. 8, 2021 (TW) ................................ 110104760

(51) Int. Cl.
H01L 33/62 (2010.01)
G09G 3/32 (2016.01)
H01L 27/15 (2006.01)
H01L 33/00 (2010.01)

(52) U.S. Cl.
CPC ............... *H01L 33/62* (2013.01); *G09G 3/32* (2013.01); *H01L 27/156* (2013.01); *H01L 33/005* (2013.01); *H01L 2933/0066* (2013.01)

(58) Field of Classification Search
CPC ..... H01L 33/62; H01L 27/156; H01L 33/005; G09G 3/32
See application file for complete search history.

(56) References Cited

U.S. PATENT DOCUMENTS 11,538,406 B2 * 12/2022 Zhao ..................... G09F 9/302
2022/0102467 A1 * 3/2022 Song ..................... G02F 1/1345

* cited by examiner

*Primary Examiner* — Ratisha Mehta
(74) *Attorney, Agent, or Firm* — JCIPRNET

(57) ABSTRACT

A manufacturing method of an electronic device includes: forming a conductive material layer on a substrate, the conductive material layer continuously extends from a first surface of the substrate to a second surface while passing through a side surface, wherein the side surface connects the first surface and the second surface, forming a first protection layer on the conductive material layer and patterning the conductive material layer by using the first protection layer as a mask to form an edge wire, wherein the edge wire is retracted relative to the first protection layer and forms an undercut structure, and forming a second protection layer on the substrate, wherein the second protection layer fills the undercut structure.

8 Claims, 16 Drawing Sheets

MANUFACTURING METHOD OF ELECTRONIC DEVICE

CROSS-REFERENCE TO RELATED APPLICATION

This application is a divisional application of and claims the priority benefit of U.S. application Ser. No. 17/376,189, filed on Jul. 15, 2021. The prior U.S. application Ser. No. 17/376,189 claims the priority benefit of U.S. Provisional Application No. 63/065,641, filed on Aug. 14, 2020 and Taiwan Application No. 110104760, filed on Feb. 8, 2021. The entirety of each of the above-mentioned patent applications is hereby incorporated by reference herein and made a part of this specification.

BACKGROUND

Technical Field

This disclosure relates to an electronic device and a manufacturing method of the electronic device.

Description of Related Art

In response to diversified applications of electronic devices, various manufacturing technologies and product designs have been developed continuously. In order to provide more diversified applications, products with a narrow bezel or no bezel have been proposed one after another. For example, a product with a narrow bezel or no bezel may be used in a spliced product (such as a spliced display panel) in addition to providing a larger functional area (such as a display area, and a touch area).

SUMMARY

This disclosure provides an electronic device that utilizes a design of an edge wire to reduce a bezel.

The disclosure provides a manufacturing method of an electronic device, which can fabricate a stable side wire to improve yield of the side wire.

An electronic device according to the disclosure includes a substrate, an edge wire, a first protection layer, and a second protection layer. The substrate has a first surface, a second surface, and a side surface connecting the first surface and the second surface. A normal vector of the side surface is different from the first surface and the second surface. The edge wire is configured on the substrate and extends from the first surface to the second surface while passing through the side surface. The first protection layer is configured on the edge wire. The edge wire is sandwiched between the substrate and the first protection layer, and the edge wire and the first protection layer form an undercut structure. The second protection layer is configured on the substrate and fills the undercut structure.

In an embodiment of the disclosure, the edge wire is retracted relative to the second protection layer.

In an embodiment of the disclosure, the second protection layer surrounds the first protection layer.

In an embodiment of the disclosure, the undercut structure is distributed along a periphery of the edge wire.

In an embodiment of the disclosure, the first protection layer has a thickness that gradually decreases outwardly.

In an embodiment of the disclosure, the electronic device further includes a driving circuit structure. The driving circuit structure is configured on the substrate, and the driving circuit structure is electrically connected to the edge wire.

In an embodiment of the disclosure, the electronic device further includes a light-emitting element. The light-emitting element is configured on the substrate and electrically connected to the driving circuit structure.

In an embodiment of the disclosure, the driving structure includes a first pad configured on the first surface and a second pad configured on the second surface, and the edge wire is connected to the first pad and the second pad.

An electronic device according to the disclosure includes a substrate, an edge wire and a protection structure. The substrate has a first surface, a second surface, and a side surface connecting the first surface and the second surface. A normal vector of the side surface is different from the first surface and the second surface. The edge wire is configured on the substrate and extends from the first surface to the second surface while passing through the side surface. The protection structure is configured on the substrate. The protection structure wraps around the edge wire, and there is an interstice between the protection structure and the edge wire.

In an embodiment of the disclosure, the interstice is a closed interstice.

In an embodiment of the disclosure, the interstice is distributed along a periphery of the edge wire.

In an embodiment of the disclosure, the electronic device further includes a driving circuit structure. The driving circuit structure is configured on the substrate, and the driving circuit structure is electrically connected to the edge wire.

A manufacturing method of the electronic device according to the disclosure includes the following steps, but is not limited thereto. A conductive material layer is formed on a substrate. The conductive material layer continuously extends from a first surface of the substrate to a second surface while passing through a side surface, in which the side surface connects the first surface and the second surface. A first protection layer is formed on the conductive material layer, and the conductive material layer is patterned using the first protection layer as a mask to form an edge wire, in which the edge wire is retracted relative to the first protection layer and forms an undercut structure. A second protection layer is formed on the substrate, and the second protection layer fills the undercut structure.

In an embodiment of the disclosure, the first protection layer is formed on the conductive material layer by a transfer printing means.

In an embodiment of the disclosure, before forming the conductive material layer, a driving circuit structure is formed on the substrate and at least a portion of the driving circuit structure is covered by a release protection layer.

In an embodiment of the disclosure, the release protection layer is removed after the second protection layer is formed.

In an embodiment of the disclosure, the second protection layer is formed on the substrate by dipping, spraying, coating or transfer printing.

In an embodiment of the disclosure, a method for forming the second protection layer includes performing multiple printing steps, and at least some of printed patterns of the multiple printing steps overlap.

In an embodiment of the disclosure, a method of patterning the conductive material layer includes an isotropic etching method.

In an embodiment of the disclosure, an etchant of the patterned conductive material layer has selectivity with regards to the conductive material layer and the first protection layer.

Based on the above, the electronic device according to the embodiments of the disclosure includes the edge wires disposed on the edge of the substrate, thereby reducing the bezel width of the electronic device, so as to achieve a narrow bezel design. In addition, the edge wires are protected by the protection structure and are not easily damaged. In some embodiments, the protection structure may include two protection layers, one of which is a protection layer used to define the contour of the edge wires, and the other layer is a protection layer that covers the side walls of the edge wires to seal the edge wires. In this way, the stability of the edge wires can be improved.

To make the abovementioned more comprehensible, several embodiments accompanied by drawings are described in detail as follows.

DESCRIPTION OF THE EMBODIMENTS

Figure 1:
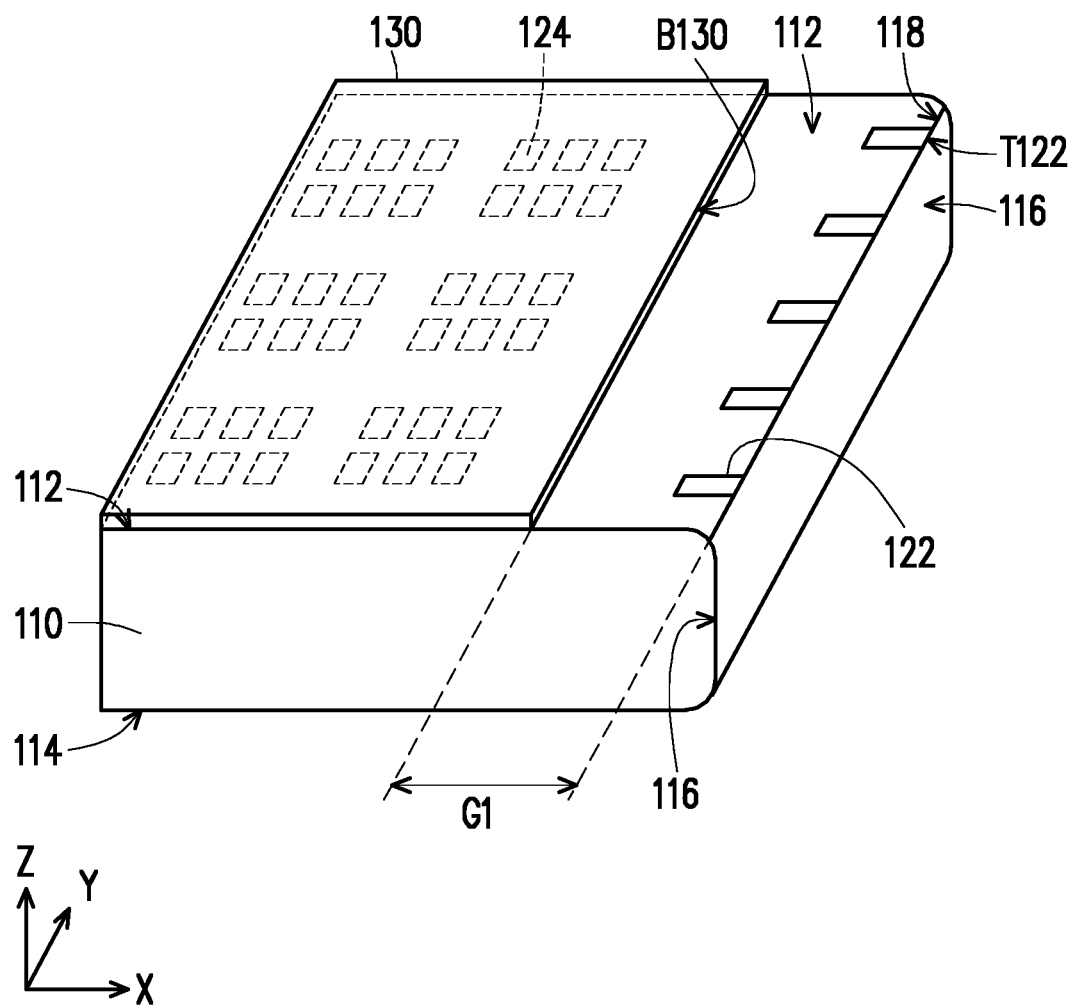
FIGS. 1 to 4 present some steps of manufacturing an electronic device according to some embodiments of the disclosure.

FIGS. 1 to 4 present some steps of manufacturing an electronic device according to some embodiments of the disclosure. In FIG. 1, a driving circuit structure 120 is formed on a substrate 110 in advance. The substrate 110 is a plate having a certain mechanical strength that may carry objects, so that multiple film layers and/or multiple objects may be configured on it. In some embodiments, a material of the substrate 110 includes glass, polymer materials, ceramics, etc. In other embodiments, the substrate 110 may be a multi-layer substrate, which is formed by stacking multiple sub-layers. The substrate 110 has a first surface 112, a second surface 114, and a side surface 116 connecting the first surface 112 and the second surface 114. Here, a normal direction of the side surface 116 is different from the first surface 112 and the second surface 114. In some embodiments, normal vectors of the first surface 112 and the second surface 114 may be parallel to each other, but are not limited thereto. For example, the first surface 112 and the second surface 114 are respectively parallel to a X direction-Y direction plane, and the side surface 116 is parallel to a Y direction-Z direction plane. In other embodiments, components disposed on the side surface 116 may be applied to other side surfaces, for example, a side surface parallel to an X direction-Z direction plane.

The driving circuit structure 120 may include a first pad 122 and a pixel pad 124, and both the first pad 122 and the pixel pad 124 are configured on the first surface 112 of the substrate 110. In some embodiments, the driving circuit structure 120 may further include a pixel circuit (not shown in FIG. 1) electrically connected to the first pad 122 and the pixel pad 124. For example, the pixel circuit (not shown in FIG. 1) may include a signal line, an active component, a passive component, etc., in which the active component is, for example, a transistor, and the passive component is, for example, a capacitor structure, but are not limited thereto. In some embodiments, the pixel circuit (not shown in FIG. 1) may be fabricated on the first surface 112 of the substrate 110 by film deposition in conjunction with photolithography or printing. Therefore, the above-mentioned transistor may be a thin film transistor, and the capacitor structure may be formed by stacking a conductive layer and a dielectric layer. In addition, in some embodiments, the driving circuit structure 120 may further include a second pad (not shown in FIG. 1) and/or a corresponding wire configured on the second surface 114 of the substrate 110.

In FIG. 1, the number of the first pad 122 is multiple, and the multiple first pads 122 may be disposed in an arrangement in a Y direction. The first pad 122 is located on the first surface 112, and the location of the first pad 122 is closer to the side surface 116 than the pixel pad 124. In some embodiments, a terminal T122 of the first pad 122 may extend to a corner 118 of the side surface 116 and the first surface 112, or even be aligned with a side surface 118. A release protection layer 130 is further formed on the substrate 110, in which the release protection layer 130 covers the pixel pad 124, while exposing the first pad 122. The release protection layer 130 may be a film layer that is not damaged in subsequent fabrication steps and may be removed in a manner that does not damage the pixel pad 124. A boundary B130 of the release protection layer 130 and the side surface 116 are separated by a gap G1 in an X direction, and the first pad 122 is located in the interval G1.

Figure 2:
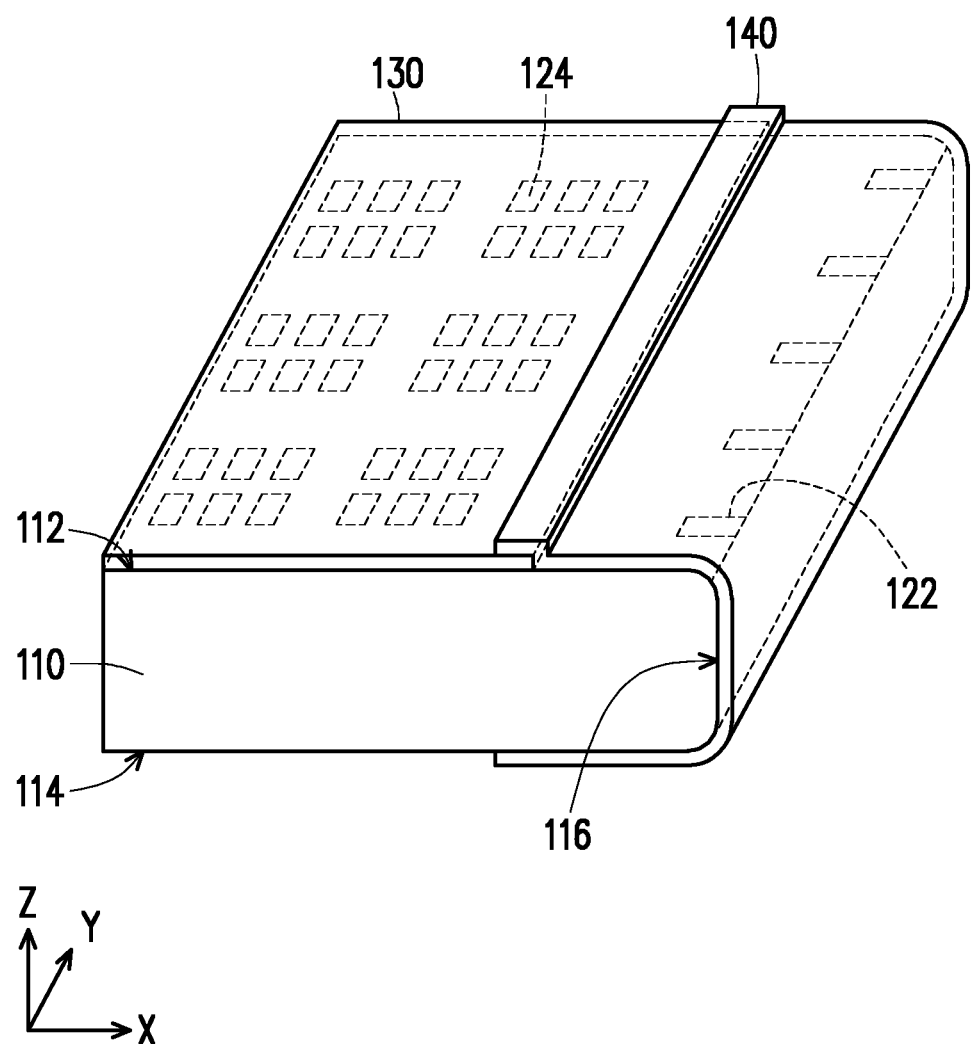

In some embodiments, the release protection layer 130 may be of a thermal curing material. A means of forming the release protection layer 130 on the substrate 110 may include coating a curable colloidal material on the substrate 110 and curing it by heating. In other embodiments, the release protection layer 130 may be a photo-curable material or a photo-thermal curable material. The release protection layer 130 is of a material that may be removed from the substrate 110. In some embodiments, the release protection layer 130 may also be formed on the second surface 114 of the substrate 110 to cover a film layer or an element on the second surface 114 that is not to be damaged, such as a trace or similar elements, is not limited thereto. In FIG. 2, a conductive material layer 140 is formed on the substrate 110. The conductive material layer 140 may cover the portion of the first surface 112 of the substrate 110 that is not covered by the release protection layer 130. The conductive material layer 140 may partially cover the release protection layer 130. The conductive material layer 140 may continuously extend from the first surface 112 to the second surface 114 while passing through the side surface 116. The conductive material layer 140 may be formed on the substrate 110 by edge sputtering. The conductive material layer 140 includes copper, aluminum, molybdenum, silver, gold, nickel, titanium ITO, IGZO, etc. The conductive material layer 140 may be in contact with and directly covers the first pad 122. When a pad (such as a second pad, not shown) is provided on the second surface 114, the conductive material layer 140 may be in contact with and directly covers the second pad on the second surface 114.

Figure 3:
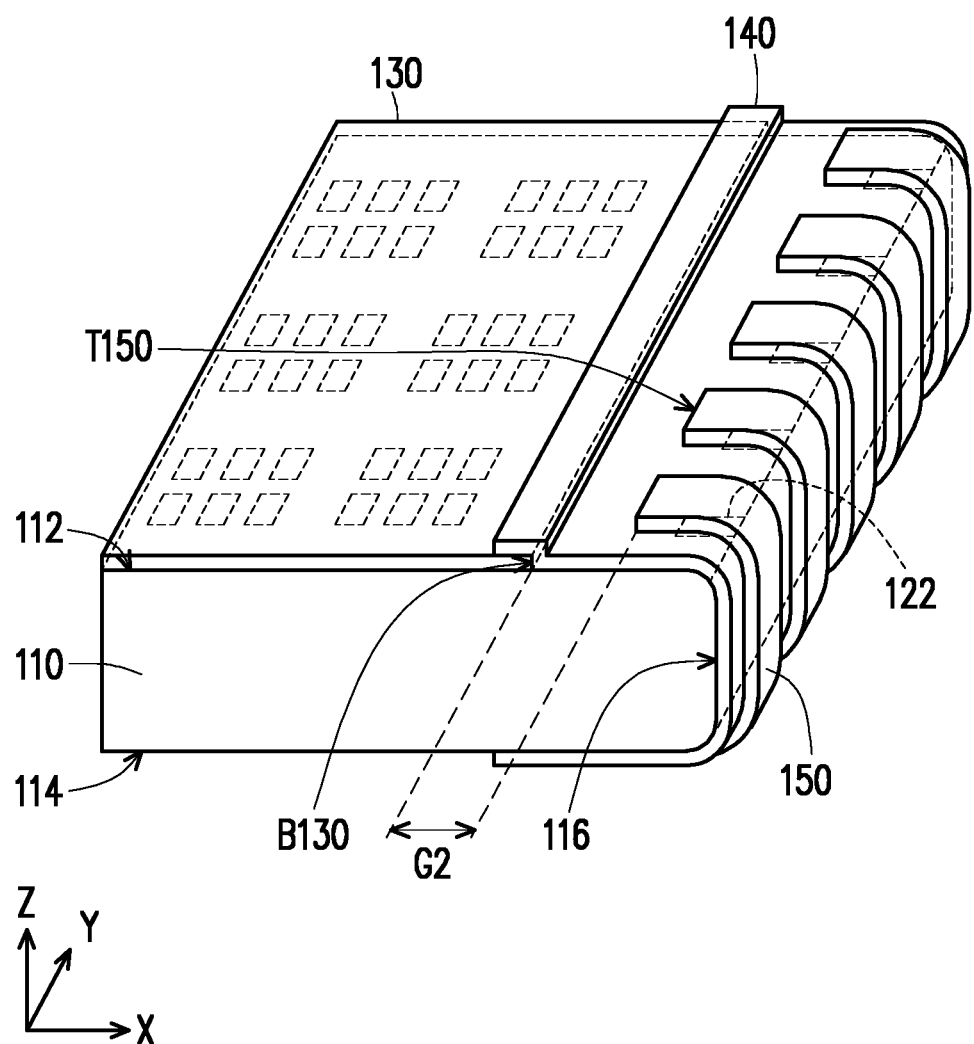

In FIG. 3, a first protection layer 150 is formed on the substrate 110. The first protection layer 150 may be fabricated on the substrate 110 by transfer printing. The first protection layer 150 may have a striped pattern, and the first protection layer 150 may continuously extend from the first surface 112 to the second surface 114 while passing through the side surface 116. As shown in FIG. 3, multiple strip-shaped first protection layers 150 may be arranged in a Y direction, and the multiple strip-shaped first protection layers 150 may be disposed corresponding to the first pads 122. In some embodiments, an orthographic projection of the first protection layer 150 on the first surface 112 in a Z direction may overlap an orthographic projection of the first pad 122 (and the corresponding second pad) on the first surface 112 in the Z direction. Furthermore, the orthographic projection of the first pad 122 (and the corresponding second pad) on the first surface 112 in the Z direction may be completely within the orthographic projection of the first protection layer 150 on the first surface 112 in the Z direction. The multiple strip-shaped first protection layers 150 are disposed corresponding to the first pads 122 in a one-to-one manner, therefore each of the first protection layers 150 overlaps only one of the first pads 122. In some embodiments, the strip-shaped first protection layer 150 has a terminal T150 and there is a gap G2 between the terminal T150 and the boundary B130 of the release protection layer 130. Therefore, the first protection layer 150 and the release protection layer 130 do not overlap each other in a thickness direction (such as the Z direction).

In some embodiments, the first protection layer 150 may be fabricated on the substrate 110 by printing. For example, in some fabrication processes, a protection layer material may be coated or applied to a printing tool, and then the printing tool is used to press the side surface 116 of the substrate 110, so that the protection layer material on the printing tool is attached to the conductive material layer 140. Then, after the printing tool is removed, a curing step may be performed on the protection layer material attached to the conductive material layer to form the first protection layer 150. In other words, the first protection layer 150 may be fabricated on the substrate 110 by imprinting. In some embodiments, the printing tool may have a strip-shaped printed pattern, so that the strip-shaped first protection layer 150 may be formed on the conductive material layer 140. In addition, the printed pattern may be fabricated using an elastic material, such as rubber. When the printing tool is pressed against the side surface 116 of the substrate 110, a portion of the printed pattern may be pressed against the conductive material layer 140 on the first surface 112 and the second surface 114, and the protection layer material is imprinted on the conductive material layer 140 on the first surface 112 and the second surface 114. For example, during the printing process, the printing tool may move in the X direction toward the substrate 110 to transfer print the protection layer material onto the conductive material layer 140 on the side surface 116, the first surface 112, and the second surface 114. In other embodiments, the printing tool may also move in the X direction toward the substrate 110 to press against the side surface 116, and then further rotate with the Y direction as an axis, to transfer print the corresponding protection layer material onto the conductive material layer 140 on the first surface 112 and the second surface 114.

Figure 4:
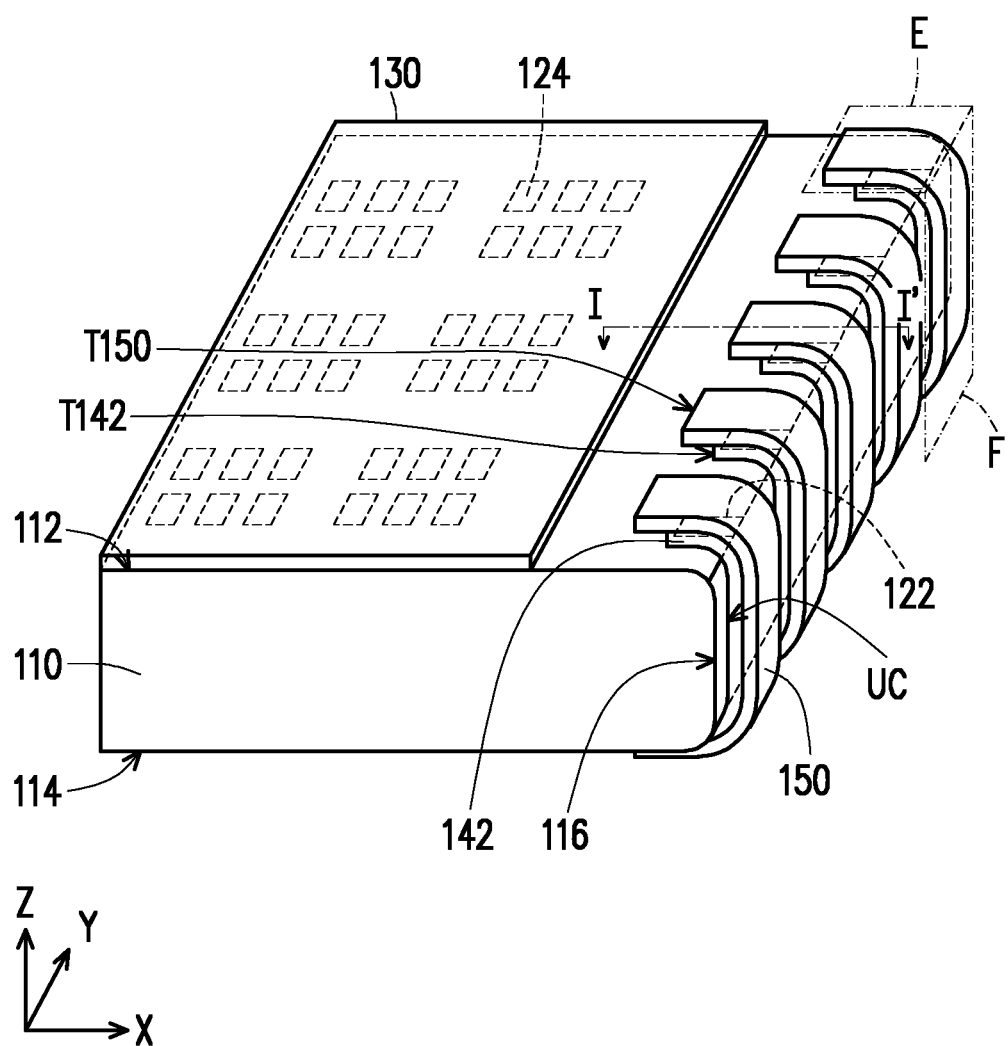

After fabrication of the first protection layers 150 in FIG. 3 is completed, a patterning step may be performed, so as to remove the conductive material layer 140 that is not covered by the first protection layers 150 to form edge wires 142 shown in FIG. 4. A method of patterning the conductive material layer 140 includes an isotropic etching method. For example, the patterning step is to enable the conductive material layer 140 that is not covered by the first protection layers 150 to be in contact with an etchant. Here, the etchant of the patterned conductive material layer 140 has selectivity with regards to the conductive material layer 140 and the first protection layer 150. In other words, the etchant used in the patterning step has, for example, a composition that does not react with the first protection layer 150, therefore the first protection layers 150 are roughly not damaged during the etching step.

In FIG. 4, the edge wires 142 are configured on the substrate 110 and correspond to the first protection layers 150. The number of the edge wire 142 may be the same as the number of the first protection layer 150. Each of the edge wires 142 is sandwiched between one of the strip-shaped first protection layers 150 and the substrate 110, and extends from the first surface 112 of the substrate 110 to the second surface 114 of the substrate 110 while passing through the side surface 116 of the substrate 110.

Figure 5:
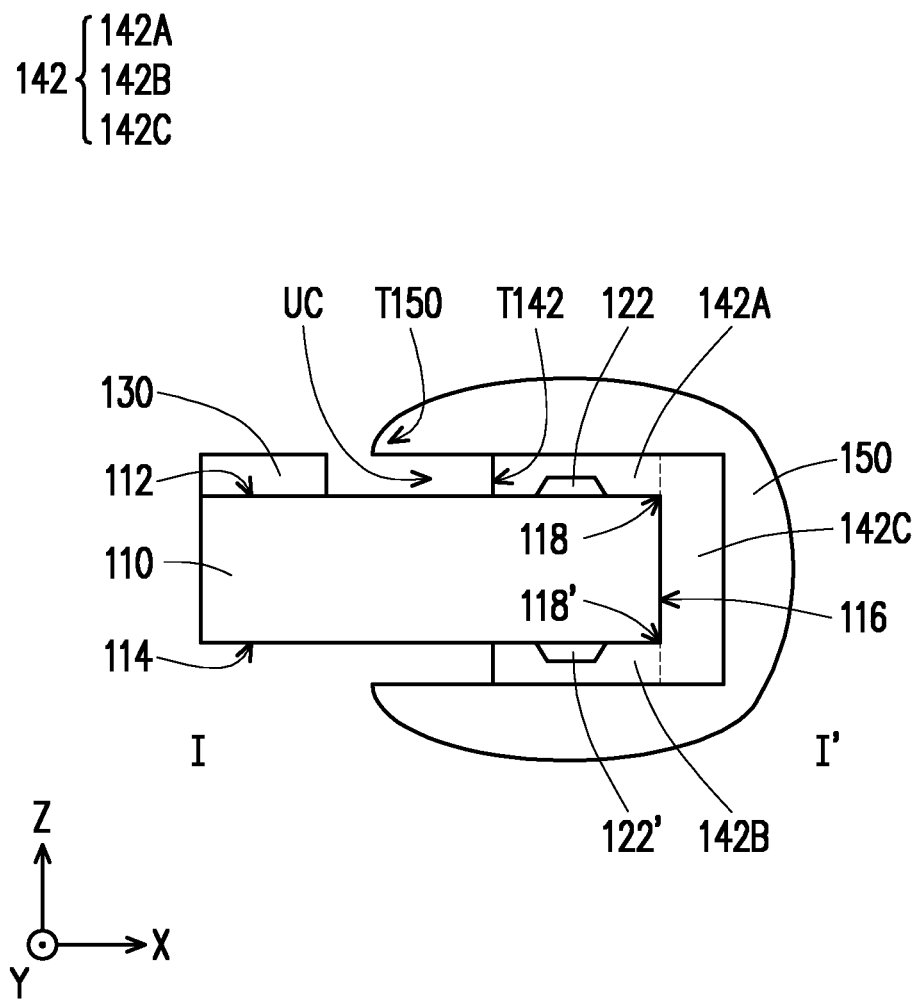
FIG. 5 is a schematic cross-sectional view of the structure in FIG. 4 along a line II'.

FIG. 5 is a schematic cross-sectional view of the structure in FIG. 4 along a line I-I', which is used to illustrate a specific structure of one of the edge wires, but the disclosure is not limited thereto. It may be seen from FIG. 5 that the first surface 112 of the substrate 110 may be disposed with the first pad 122, the second surface 114 of the substrate 110 may be disposed with a second pad 122', the edge wire 142 extends from the first surface 112 of the substrate 110 to the second surface 114 of the substrate 110 while passing through the side surface 116 of the substrate 110, and the first protection layer 150 is disposed on a side of the edge wire 142 away from the substrate 110.

The edge wire 142 may include a first wire segment 142A, a second wire segment 142B, and a third wire segment 142C. The first wire segment 142A is disposed on the first surface 112, and extends, for example, from the corner 118 of the first surface 112 and the side surface 116 toward the first pad 122 in the X direction, and even extends beyond the first pad 122. The second wire segment 142B is disposed on the second surface 114, extends, for example, from a corner 118' of the second surface 114 and the side surface 116 toward the second pad 122' in the X direction, and even extends beyond the second pad 122'. The third wire segment 142C is disposed on the side surface 116 and extends in the Z direction to be connected to the first wire segment 142A and the second wire segment 142B. Therefore, the edge wire 142 is a three-dimensional wire, which has a three-dimensional U-shaped structure and surrounds an edge of the substrate 110.

In the etching step of patterning the conductive material layer 140 in FIG. 3 into the edge wire 142, the conductive material layer 140 may be over-etched to ensure that the adjacent edge wires 142 are disconnected from each other. For example, due to over-etching, a contour of the edge wire 142 may be retracted relative to a contour of the first protection layer 150 and forms an undercut structure UC. In FIG. 5, the terminal T150 of the first protection layer 150 may be protruded relative to a terminal T142 of the edge wire 142 toward the release protection layer 130, or the terminal T142 of the edge wire 142 may be retracted relative to the terminal T150 of the first protection layer 150 and forms the undercut structure UC. In addition, a thickness of the first protection layer 150 may be non-uniform. For example, the thickness of the first protection layer 150 may be thinner toward an edge of the contour.

Figure 6:
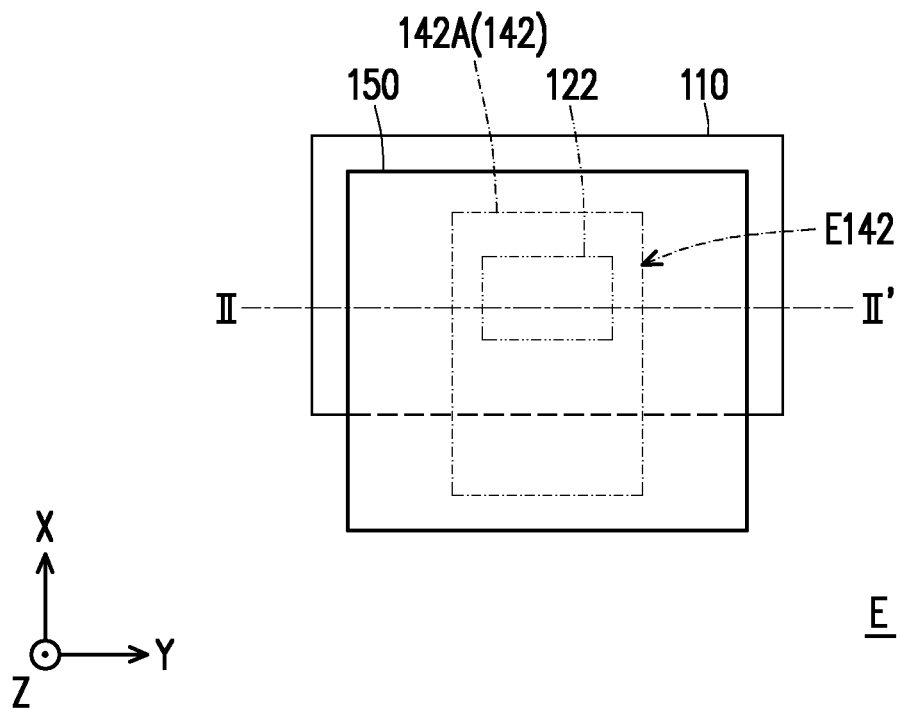
FIG. 6 is a partial enlarged schematic view of a region E in FIG. 4.

FIG. 6 is a partial enlarged schematic view of a region E in FIG. 4, in which the enlarged view of FIG. 6 presents a top view of the structure in FIG. 4 viewed in the Z direction. In FIG. 6, the edge wire 142 may protrude outward in the X direction from the side surface 116 of the substrate 110. A portion of the edge wire 142 located on the substrate 110 is the first wire segment 142A, and a portion protruding outward in the X direction from the side surface 116 of the substrate 110 is the third wire segment 142C. The first protection layer 150 completely shields the edge wire 142, therefore a portion of the first protection layer 150 covering the third wire segment 142C is also protruding outward in the X direction from the side surface 116 of the substrate 110.

Figure 7:
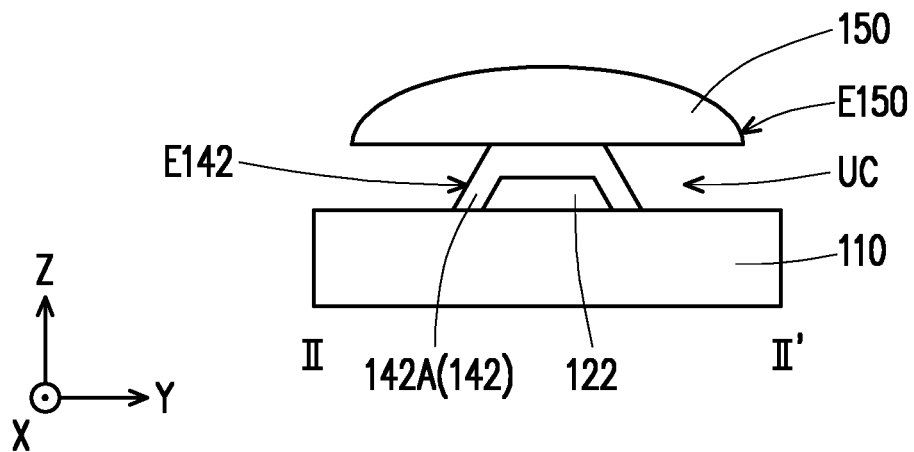
FIG. 7 is a schematic cross-sectional structural view along a line II-IF in FIG. 6.

FIG. 7 is a schematic cross-sectional structural view along a line II-IF in FIG. 6. In FIGS. 6 and 7, the first wire segment 142A of the edge wire 142 is in contact with the first pad 122 on the substrate 110 and may completely wrap around the first pad 122. A side wall E142 of the edge wire 142 may be retracted relative to a side wall E150 of the first protection layer 150 and forms the undercut structure UC along the side wall E142. FIGS. 6 and 7 mainly present a configuration design of the first wire segment 142A of the edge wire 142, and the design in FIGS. 6 and 7 may also be applied to the second wire segment 142B, therefore a configuration design of the second wire segment 142B is not repeated.

Figure 8:
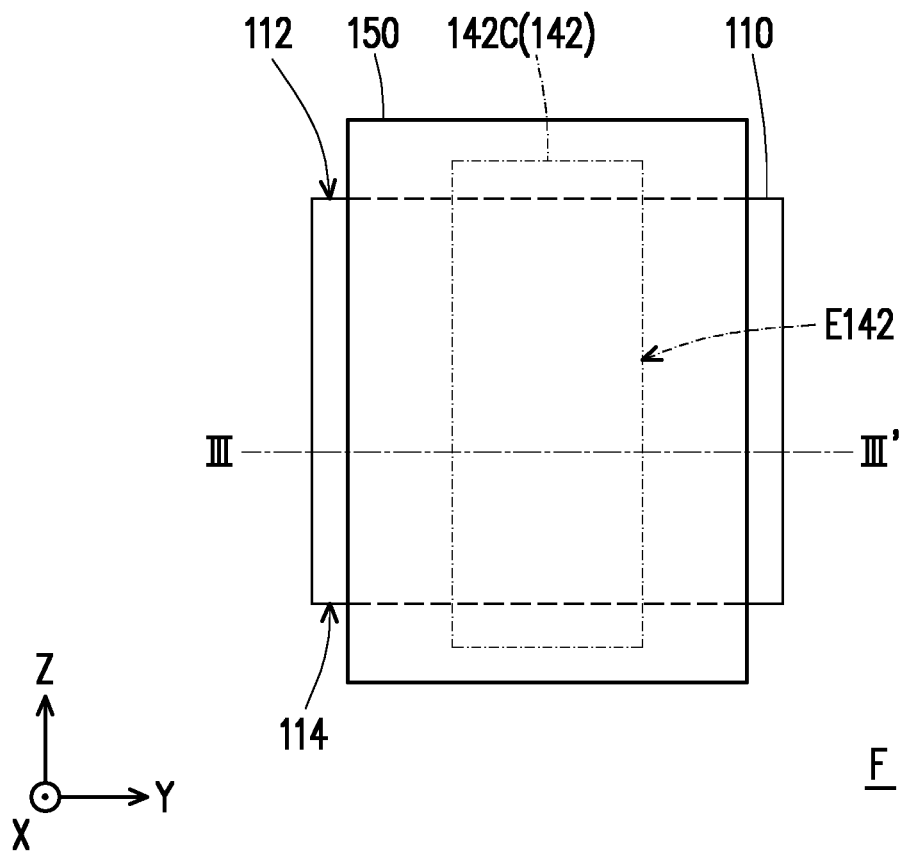
FIG. 8 is a partial enlarged schematic view of a region F in FIG. 4.
Figure 9:
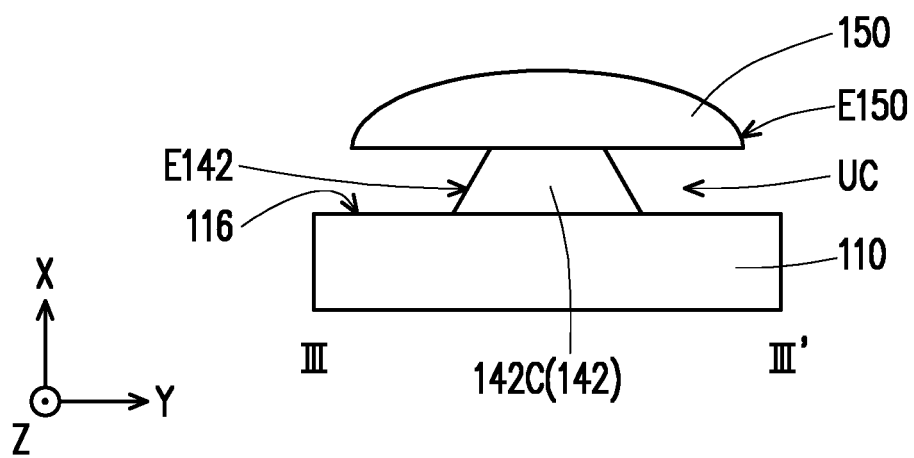
FIG. 9 is a schematic cross-sectional structure view along a line in FIG. 8.
Figure 10:
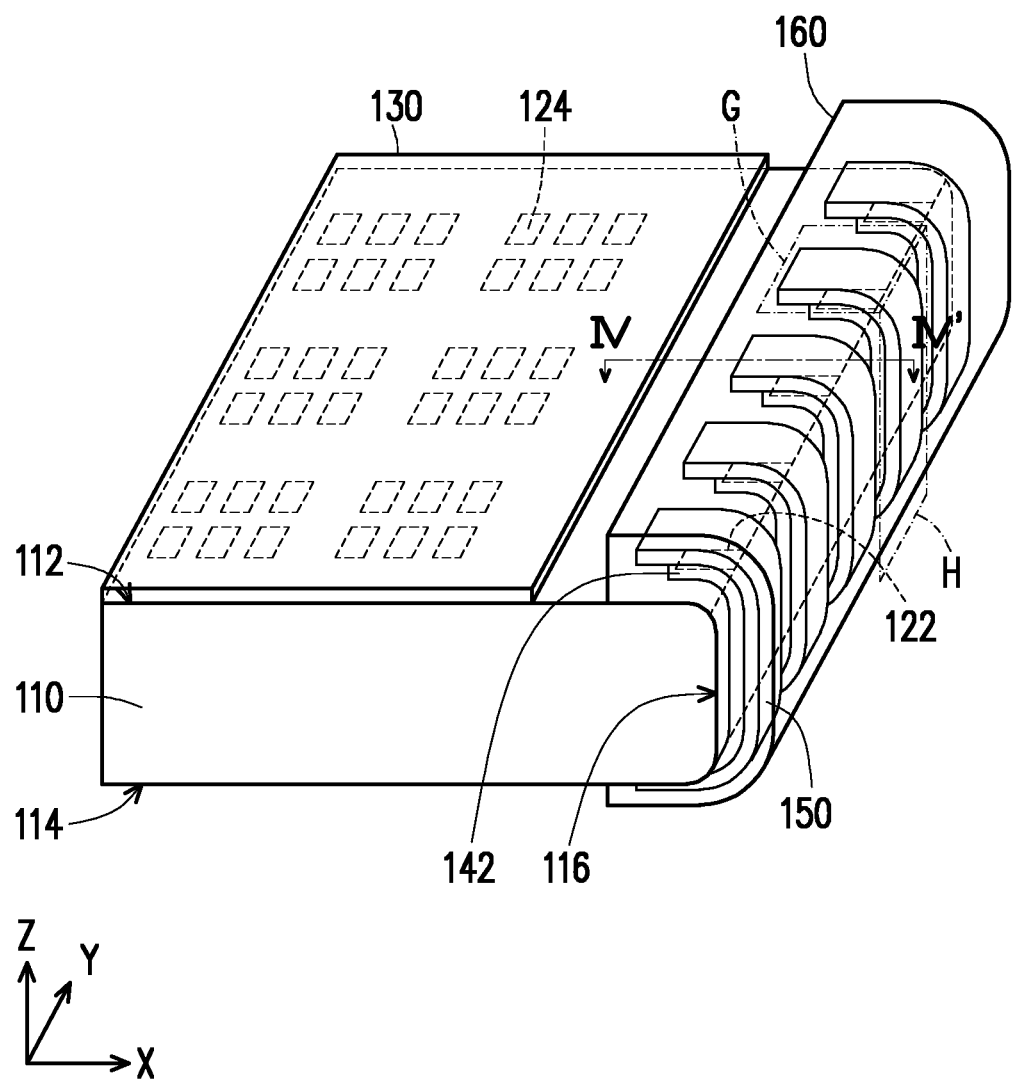
FIG. 10 presents some steps of manufacturing an electronic device according to some embodiments of the disclosure.
Figure 11:
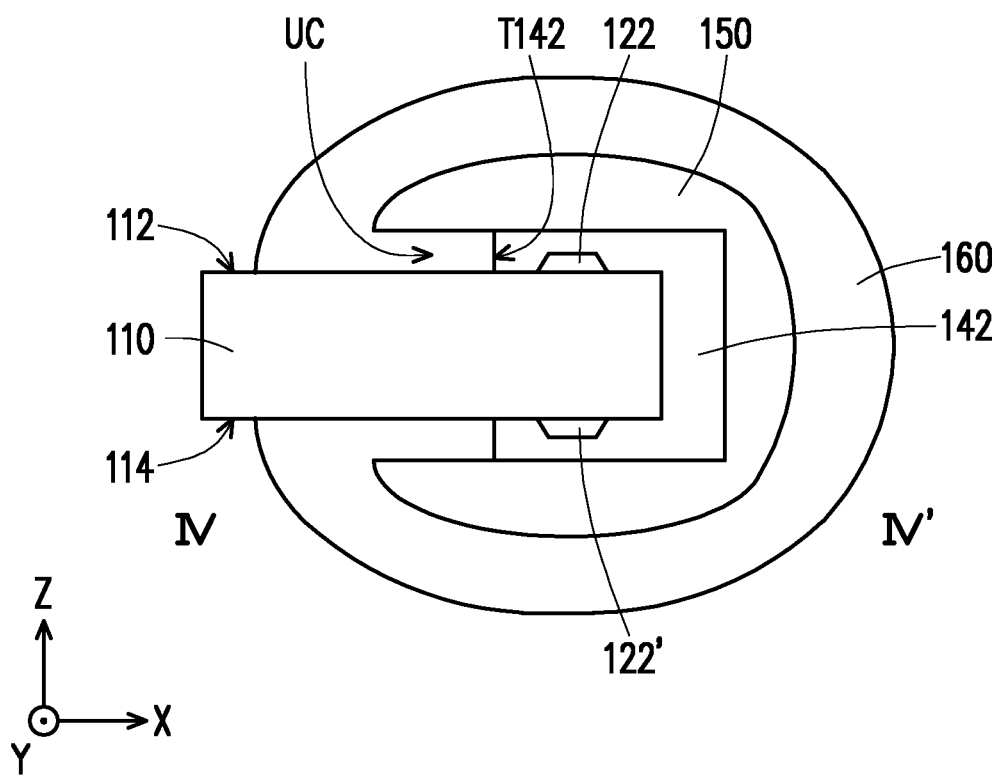
FIG. 11 is a schematic cross-sectional view along a line IV-IV' in FIG. 10.

FIG. 8 is a partial enlarged schematic view of a region F in FIG. 4, in which the enlarged view of FIG. 8 presents a side view of the structure in FIG. 4 viewed in the X direction, and FIG. 8 mainly presents a configuration design of the third wire segment 142C of the edge wire 142. FIG. 9 is a schematic cross-sectional structural view along a line in FIG. 8. In FIGS. 8 and 9, the third wire segment 142C of the edge wire 142 is in contact with the side surface 116 of the substrate 110 and extends toward the first surface 112 and the second surface 114 in the Z direction from in-between. The side wall E142 of the edge wire 142 may be retracted relative to the side wall E150 of the first protection layer 150 and forms the undercut structure UC along the side wall E142. The undercut structure UC along the terminal T142 of the edge wire 142 in FIG. 5, the undercut structure UC along the side wall E142 in FIG. 6 and the undercut structure UC along the sidewall E142 in FIG. 8 may be continuous. Therefore, the undercut structure UC is essentially a structure distributed along the contour of the edge wire 142. In addition, it may be seen from FIGS. 5, 7 and 9 that the first protection layer 150 has the thickness that gradually decreases outwardly. FIG. 10 presents some steps of manufacturing an electronic device according to some embodiments of the disclosure, and FIG. 11 is a schematic cross-sectional view along a line IV-IV' in FIG. 10. The steps shown in FIG. 10 are mainly further forming a second protection layer 160 on the structure in FIG. 4. The second protection layer 160 is configured on the substrate 110 and wraps around the first protection layers 150. In FIGS. 10 and 11, the second protection layer 160 not only wrap around the first protection layer 150, but also fills the undercut structure UC, therefore the second protection layer 160 may be in contact with the terminal T142 of the edge wire 142. In other words, the second protection layer 160 may surround the first protection layer 150, so that the first protection layers 150 are sealed in the second protection layer 160. The second protection layer 160 may be formed on the substrate 110 by dipping, spraying, coating or transfer printing.

Figure 12:
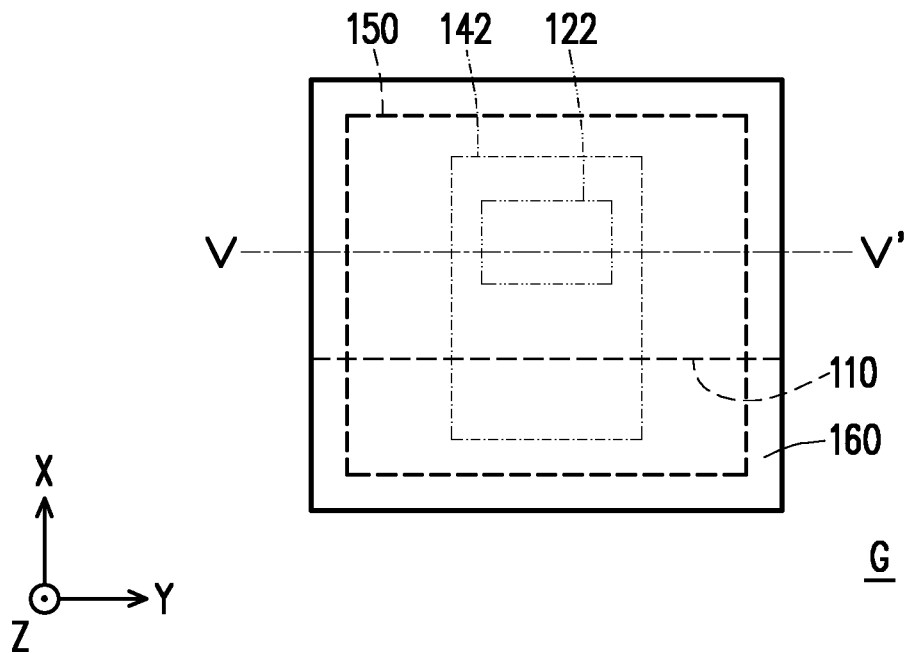
FIG. 12 is a partial enlarged schematic view of a region G in FIG. 10.
Figure 13:
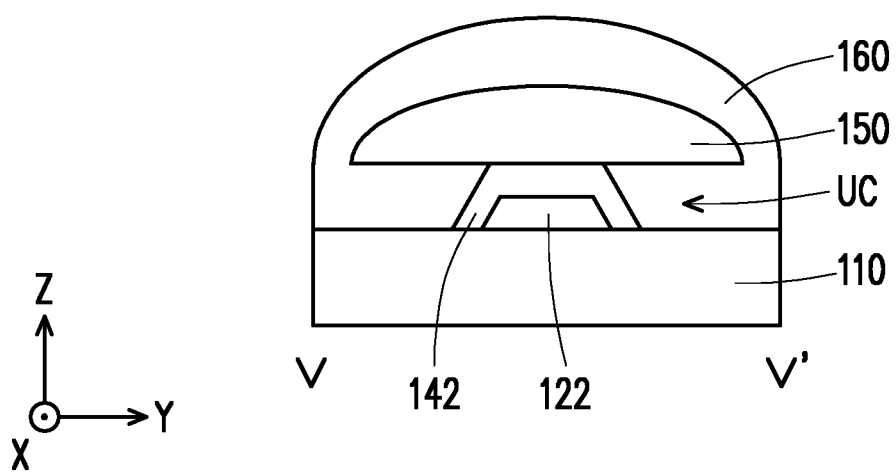
FIG. 13 is a schematic cross-sectional view along a line V-V' in FIG. 12.
Figure 14:
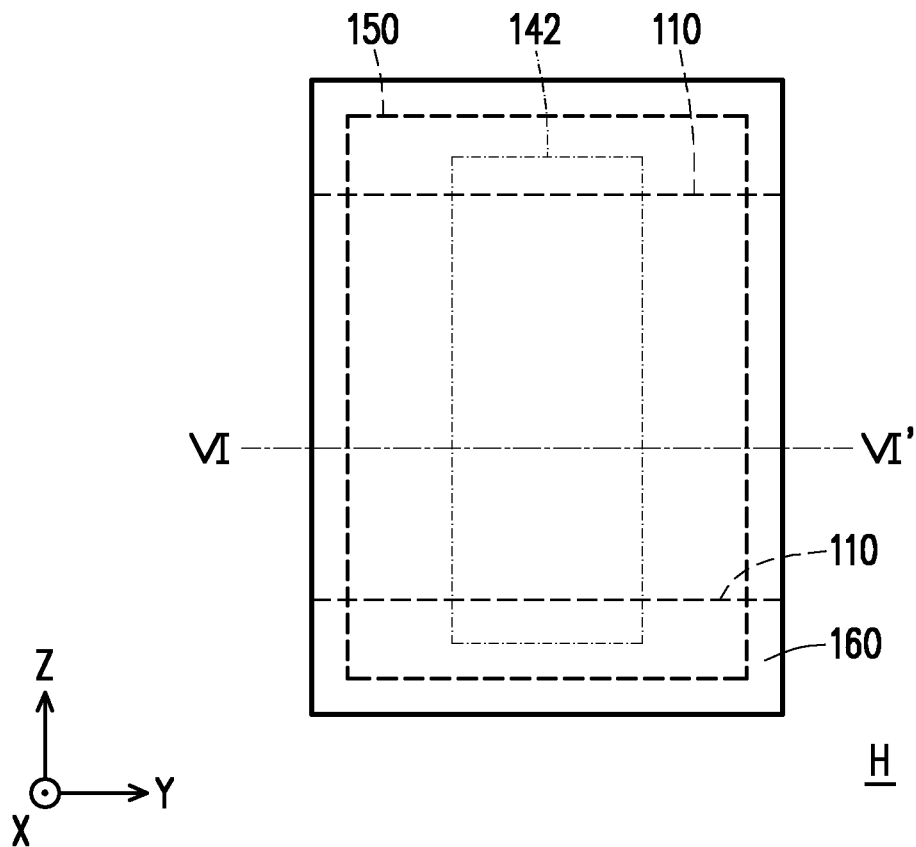
FIG. 14 is a partial enlarged schematic view of a region H in FIG. 10.
Figure 15:
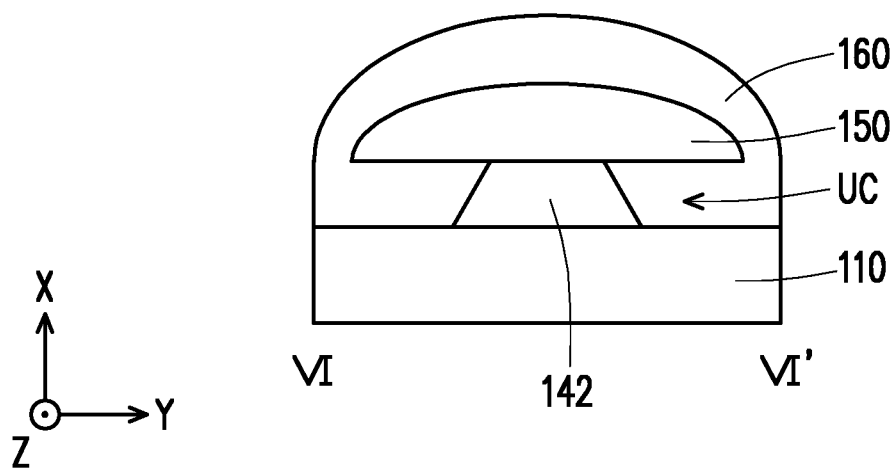
FIG. 15 is a schematic cross-sectional view along a line VI-VI' in FIG. 14.

FIG. 12 is a partial enlarged schematic view of a region G in FIG. 10, in which the enlarged view of FIG. 12 presents a top view of the structure in FIG. 10 viewed in the Z direction. FIG. 13 is a schematic cross-sectional view along a line V-V' in FIG. 12. FIG. 14 is a partial enlarged schematic view of a region H in FIG. 10, in which the enlarged view of FIG. 14 presents a side view of the structure in FIG. 10 viewed in the X direction. FIG. 15 is a schematic cross-sectional view along a line VI-VI' in FIG. 14. It may be seen from FIGS. 12 to 16 that, in addition to wrapping around the first protection layer 150, the second protection layer 160 also fills the undercut structure UC, therefore the second protection layer 160 may be in contact with the terminal T142 of the edge wire 142. In some embodiments, the second protection layer 160 may be fabricated by printing (such as transfer printing) or by immersion. For example, the second protection layer 160 may be fabricated by immersing the substrate 110 in a solution of a protection material, so that the protection material adheres to the substrate 110, and then the second protection layer 160 may be formed after the protection material is cured.

The materials of the first protection layer 150 and the second protection layer 160 may include polyester resins, phenolic resins, alkyd resins, polycarbonate resins, and polycarbonate resins, polyamide resins, polyurethane resins, silicone resins, epoxy resins, polyethylene resins, acrylic resins, polystyrene resins, polypropylene resins, or other materials with waterproof protection. In some embodiments, the first protection layer 150 and the second protection layer 160 may be composed of different materials or the same material.

Figure 16:
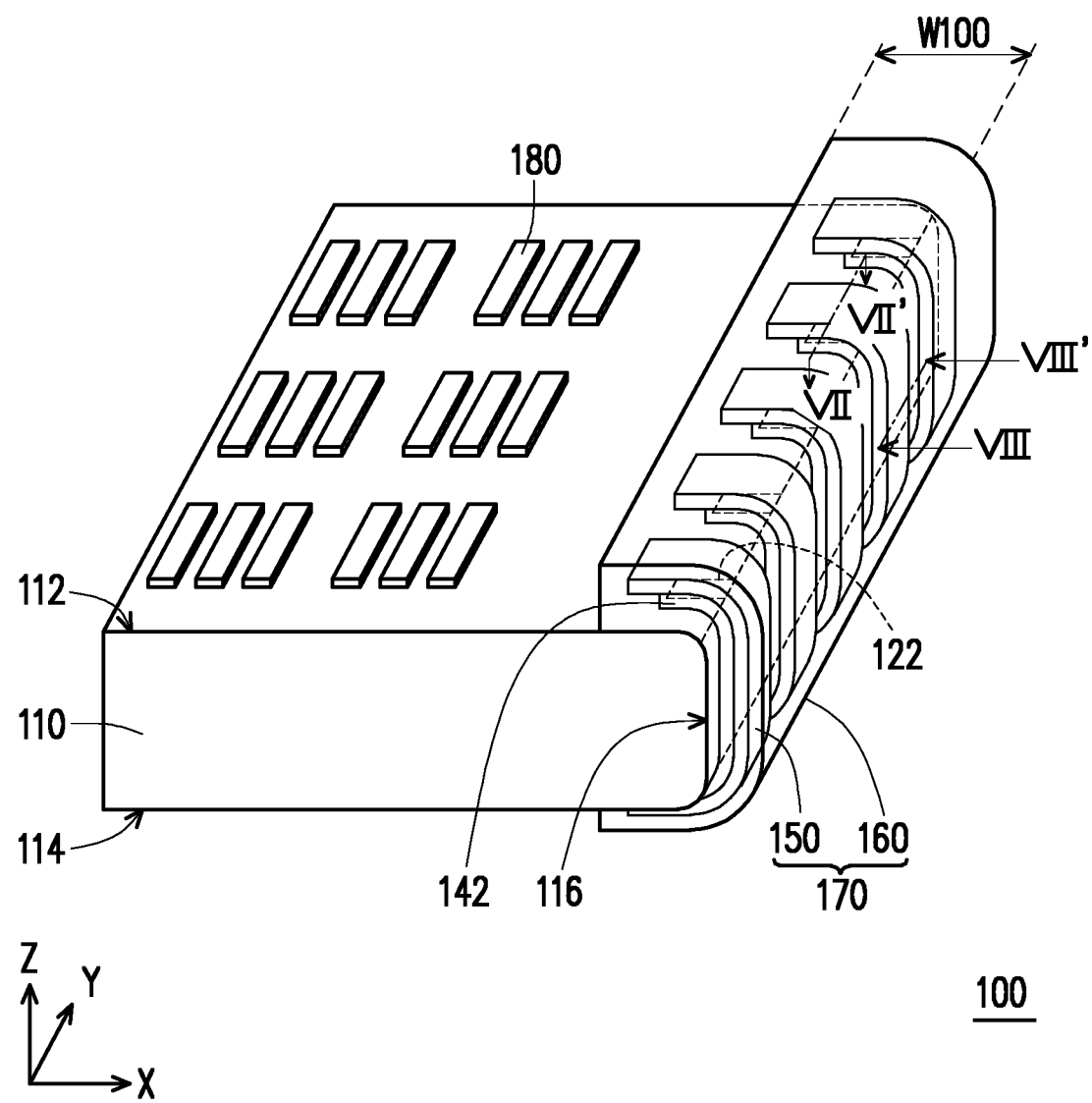
FIG. 16 is a schematic view of an electronic device according to some embodiments of the disclosure.

FIG. 16 is a schematic diagram of an electronic device according to some embodiments of the disclosure. An electronic device 100 in FIG. 16 includes the substrate 110, the edge wire 142, a protection structure 170, and a light-emitting element 180. In some embodiments, the electronic device 100 may be a device formed by removing the release protection layer 130 (marked in FIG. 10) from the structure in FIG. 10 and then bonding the light-emitting element 180 to the pixel pad 124. Here, the protection structure 170 may include the first protection layers 150 and the second protection layer 160. Specifically, reference may be made to the description in the foregoing paragraphs for the structural design and the configuration relationship of the substrate 110, the edge wire 142, the first protection layers 150, and the second protection layer 160, which are not repeated here.

The substrate 110 has the first surface 112, the second surface 114, and the side surface 116 connecting the first surface 112 and the second surface 114. The substrate 110 may be further disposed with the driving circuit structure 120 shown in FIG. 1, and the driving circuit structure 120 may include the first pad 122, the second pad 122', and the pixel pad 124 (reference may be made to FIGS. 1, 5, and 11). The light-emitting element 180 is then bonded to the pixel pad 124. In some embodiments, the light-emitting element 180 may include a light-emitting diode, which is, for example, a micron light-emitting diode, a millimeter light-emitting diode, or similar elements. In other embodiments, the substrate 110 may be further disposed with elements having other functions such as a touch element and a sensing element.

In the embodiment, the edge wire 142 extends from the first surface 112 to the second surface 114 while passing through the side surface 116. The edge wire 142 may electrically connect the first pad 122 on the first surface 112 to the second pad (such as the second pad 122' shown in FIGS. 5 and 11) on the second surface 114. In addition, a circuit board or other external circuit structure intended to be connected to the electronic device 100 may be connected to a circuit or a pad on the second surface 114 without having to be connected to the first surface 112. Therefore, a periphery of the first surface 112 does not need to reserve a bonding area for bonding to an external circuit structure. In other words, a larger area may be left on the first surface 112 for the disposition of the light-emitting element 180, achieving a narrow bezel design. In some embodiments, an extension length of the edge wire 142 in the X direction on the first surface 112 is less than a bonding width required to be reserved during bonding to the circuit board. For example, a bezel width W100 of the electronic device 100 on the first surface 112 is, for example, 5 mm. Compared with a design of bonding the circuit board to the first surface 112, the electronic device 100 may have a smaller bezel width, and even a bezel width that cannot be easily recognized by a user. Therefore, the electronic device 100 may be applied to a spliced display, and when it is spliced with other electronic devices 100, it is not easy for the user to perceive existence of an edge. In addition, the electronic device 100 may be applied to other designs that require extremely small bezel widths or even not having a bezel.

The protection structure 170 wraps around the edge wire 142. As mentioned in the foregoing, the protection structure 170 includes the first protection layers 150 and the second protection layer 160. The first protection layers 150 shield the edge wires 142, and the contour of the edge wires 142 is retracted relative to the first protection layers 150. The second protection layer 160 covers the first protection layer 150 and fills the undercut structure (the undercut structure UC described in FIGS. 4 to 14) that is formed by the first protection layers 150, the edge wire 142 and the substrate 110.

Figure 17:
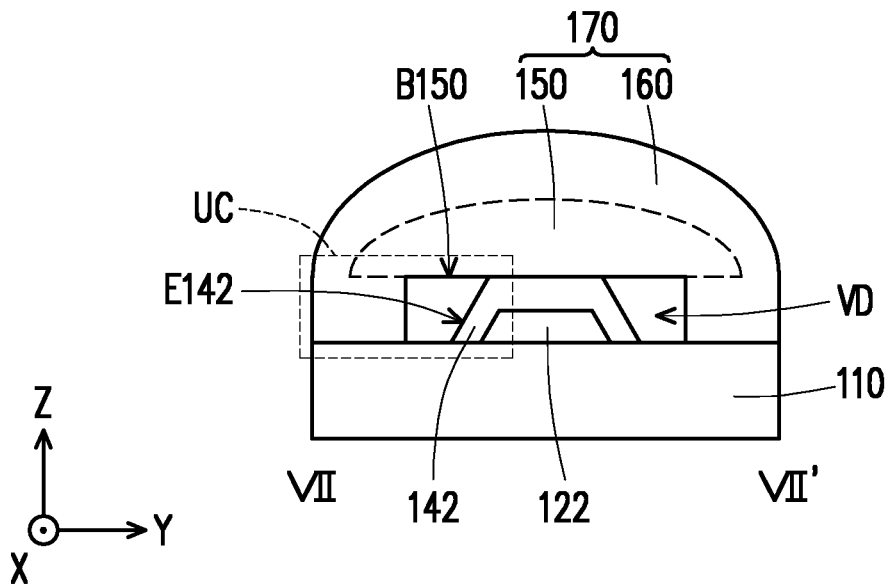
FIG. 17 is a schematic cross-sectional view along a line VII-VII' in FIG. 16 according to some embodiments of the disclosure.
Figure 18:
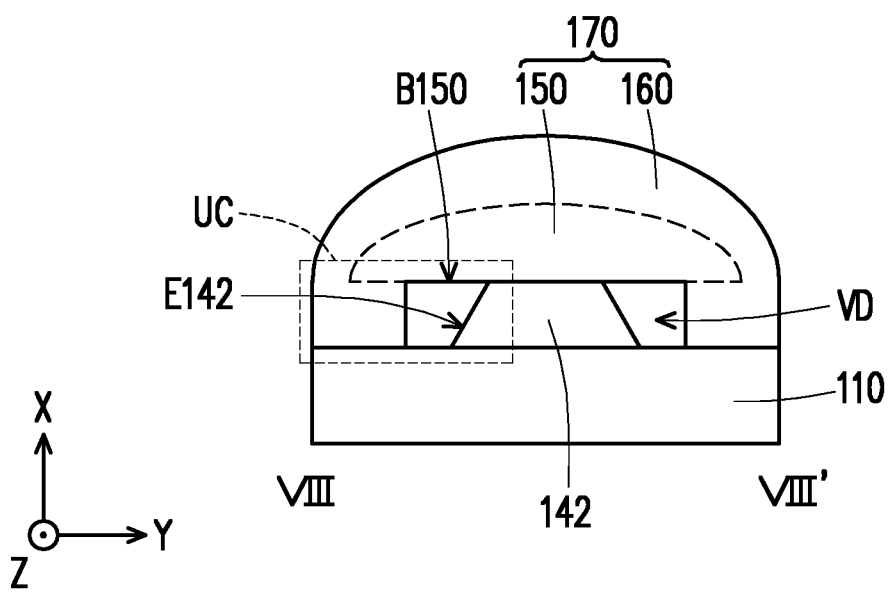
FIG. 18 is a schematic cross-sectional view along a line VIII-VIII' in FIG. 16.

FIG. 17 is a schematic cross-sectional view along a line VII-VII' in FIG. 16 according to some embodiments of the disclosure, and FIG. 18 is a schematic cross-sectional view along a line VIII-VIII' in FIG. 16. In FIGS. 17 and 18, the first protection layer 150 and the second protection layer 160 of the protection structure 170 are made of, for example, the same material. As shown in FIGS. 17 and 18, when the first protection layer 150 and the second protection layer 160 are fabricated by the same material, a boundary between the first protection layer 150 and the second protection layer 160 is not obvious, as shown by the dotted line. At this time, the protection structure 170 may be roughly an integrated structure. When fabricating the second protection layer 160, based on a size of the undercut structure UC and characteristics of the protection material, the second protection layer 160 may not be able to completely fill the undercut structure UC formed by the first protection layer 150, the edge wire 142, and the substrate 110, and therefore forming an interstice VD at the undercut structure UC.

The interstice VD may be distributed in a scattered manner along the contour of the edge wire 142 and exist between the protection structure 170 and the edge wire 142. The interstice VD may be located between a partial bottom surface B150 of the first protection layer 150 protruding from the edge wire 142 and the side wall E142 of the edge wire 142. The interstice VD may be located between the first surface 112 of the substrate 110 and the side wall E142 of the edge wire 142. The interstice VD may be a sealed interstice and sealed between the substrate 110, the edge wire 142 and the protection structure 170. In some embodiments, when the first protection layer 150 and the second protection layer 160 are made of different materials, the interstice VD may also exist between the substrate 110, the edge wire 142 and the protection structure 170. At this time, the interstice VD may be roughly distributed between the substrate 110, the edge wire 142, the first protection layer 150, and the second protection layer 160.

Figure 19:
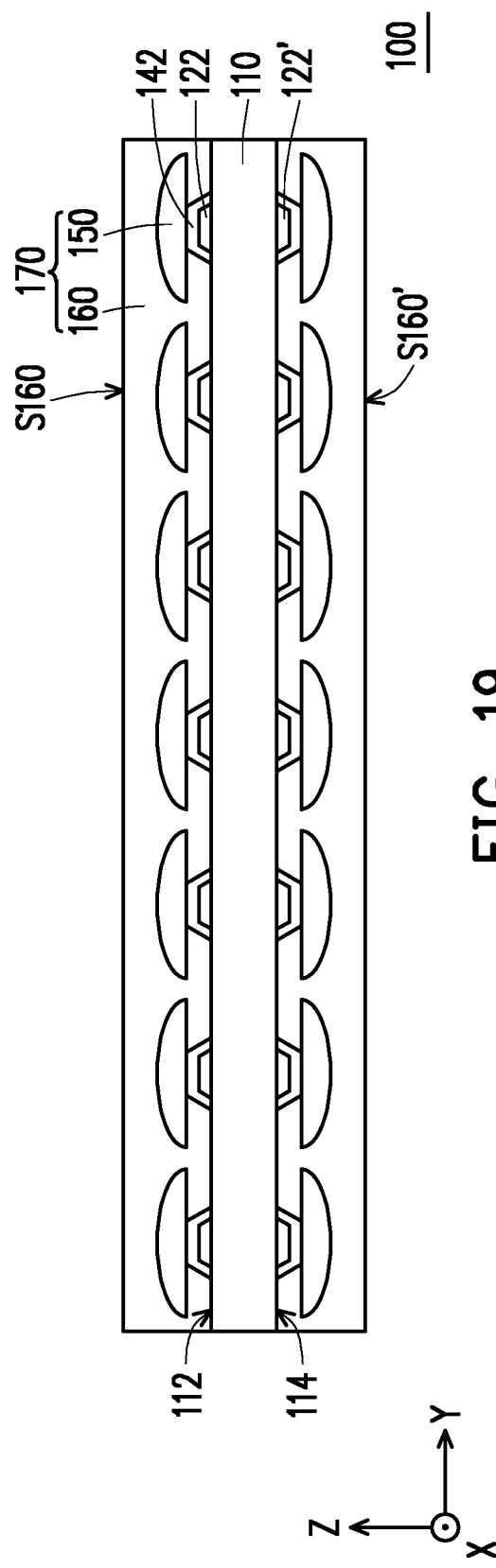
FIG. 19 is a schematic cross-sectional view of the electronic device in FIG. 16 along an extension line of the line VII-VII' according to some embodiments.

FIG. 19 is a schematic cross-sectional view of the electronic device in FIG. 16 along an extension line of the line VII-VII' according to some embodiments. In FIG. 19, the electronic device 100 includes the substrate 110, the first pad 122, the second pad 122', the edge wire 142, the first protection layers 150, and the second protection layer 160. The first protection layers 150 and the second protection layer 160 may form the protection structure 170. As shown in the embodiment in FIG. 19, the second protection layer 160 may be a flat layer having flat outer surfaces S160 and S160'. The outer surface S160 of the second protection layer 160 is a surface of a portion of the second protection layer 160 disposed on the first surface 112 that is away from the substrate 110. The outer surface S160' of the second protection layer 160 is a surface of a portion of the second protection layer 160 disposed on the second surface 114 that is away from the substrate 110. The outer surfaces S160 and S160' may roughly be parallel to the first surface 112 and the second surface 114, that is, the outer surfaces S160 and S160' may extend roughly along the plane of the X direction and the Y direction.

Figure 20:
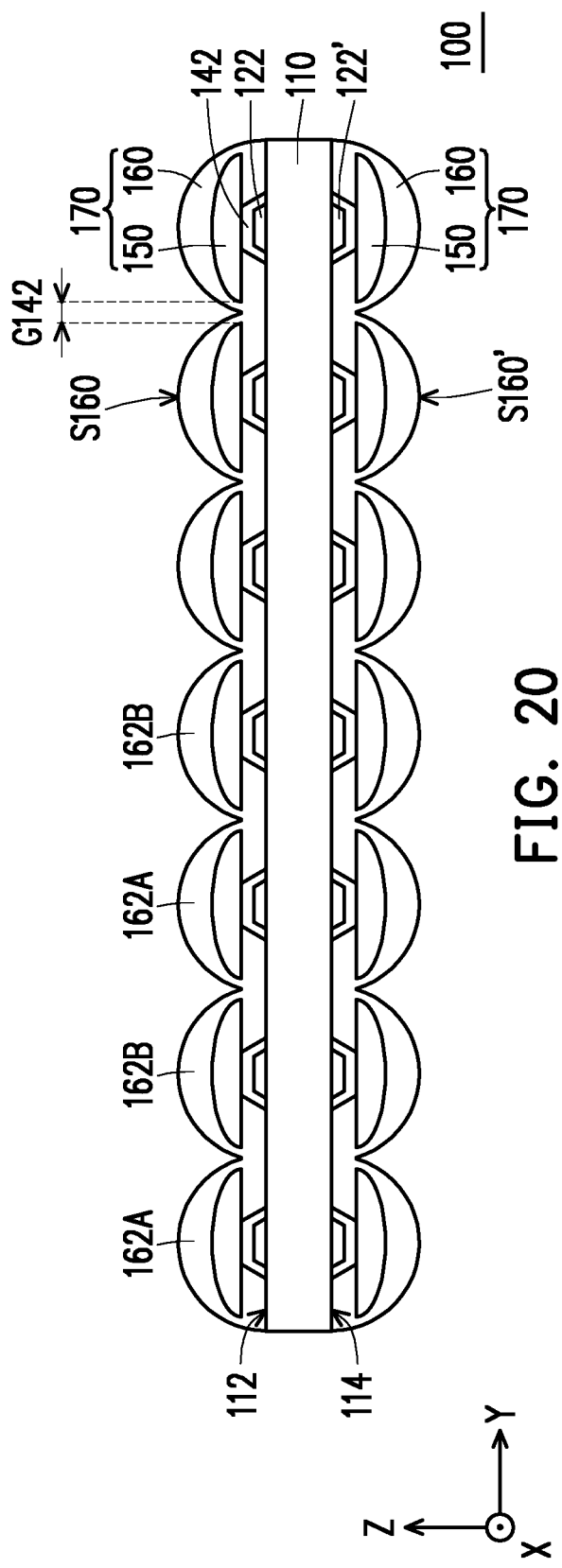
FIG. 20 is a schematic cross-sectional view of the electronic device in FIG. 16 along the extension line of the line VII-VII' according to some embodiments.

FIG. 20 is a schematic cross-sectional view of the electronic device in FIG. 16 along the extension line of the line VII-VII' according to some embodiments. In FIG. 20, the electronic device 100 includes the substrate 110, the first pad 122, the second pad 122', the edge wire 142, the first protection layers 150, and the second protection layer 160. The first protection layers 150 and the second protection layer 160 may form the protection structure 170. As shown in the embodiment in FIG. 20, the second protection layer 160 may have wavy outer surfaces S160 and S160'. The outer surface S160 and the outer surface S160' fluctuate, for example, according to the distribution of the edge wires 142. That is, the outer surface S160 is farther away from the substrate 110 at a position corresponding to the edge wire 142, and is closer to the substrate 110 at a gap G142 of the edge wire 142. In some embodiments, the second protection layer 160 may be fabricated on the substrate 110 by printing.

For example, the second protection layer 160 may include multiple first printed patterns 162A and multiple second printed patterns 162B. The first printed patterns 162A may be fabricated on the substrate 110 using a same printing tool in a same printing step. Similarly, the second printed patterns 162B are also fabricated on the substrate 110 by a same printing tool in a same printing step. The first printed patterns 162A and the second printed patterns 162B may be fabricated on the substrate 110 using the same printing tool but in different printing steps. In other words, a method of forming the second protection layer 160 includes multiple printing steps, but the disclosure is not limited thereto. The first printed patterns 162A are separated from each other by gaps, and the second printed patterns 162B are also separated from each other by gaps. The first printed patterns 162A and the second printed patterns 162B at least partially overlap. The first printed patterns 162A and the second printed patterns 162B may be alternately distributed and form the second protection layer 160 that is continuously distributed in the Y direction.

Figure 21:
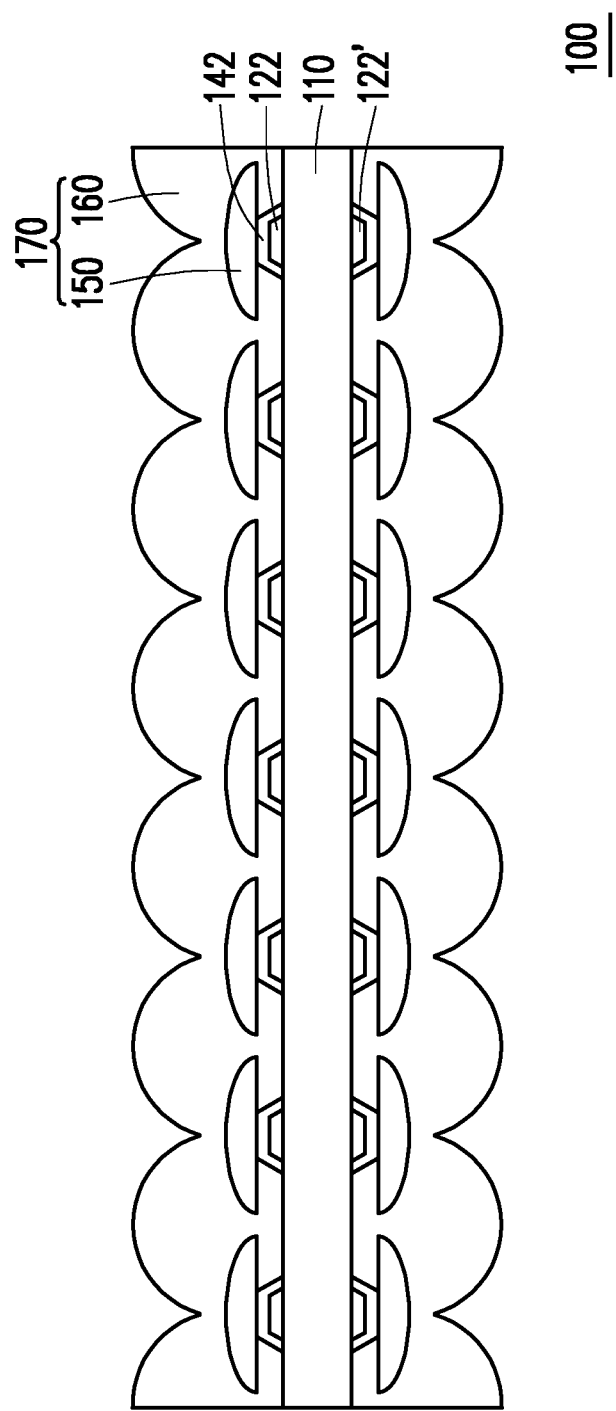
FIG. 21 is a schematic cross-sectional view of the electronic device in FIG. 16 along the extension line of the line VII-VII' according to some embodiments.

FIG. 21 is a schematic cross-sectional view of the electronic device in FIG. 16 along the extension line of the line VII-VII' according to some embodiments. In FIG. 21, the electronic device 100 includes the substrate 110, the first pad 122, the second pad 122', the edge wire 142, the first protection layers 150, and the second protection layer 160. The first protection layers 150 and the second protection layer 160 may form the protection structure 170. As shown in the embodiment in FIG. 21, the second protection layer 160 may have wavy outer surfaces S160 and S160'. Fluctuation frequencies of the outer surface S160 and the outer surface S160' alternates with the distribution of the edge wires 142. In other words, the outer surface S160 is closer to the substrate 110 at a position corresponding to the edge wire 142, and is away from the substrate 110 at the gap G142 of the edge wire 142. A fabrication means of the second protection layer 160 in FIG. 21 may be roughly the same as the fabrication means of the second protection layer 160 in FIG. 20, and therefore, description is omitted. In other words, the second protection layer 160 may be fabricated on the substrate 110 by a multiple printing means. The multiple printing means may enable the printed patterns to partially overlap each other, which helps to determine continuity of the second protection layer 160. Therefore, the second protection layer 160 may truly wrap around the edge wires 142 to provide an ideal protection and blocking function. For example, the second protection layer 160 may ensure that the edge wires 142 are not affected by external moisture and become degraded or oxidized.

Figure 22:
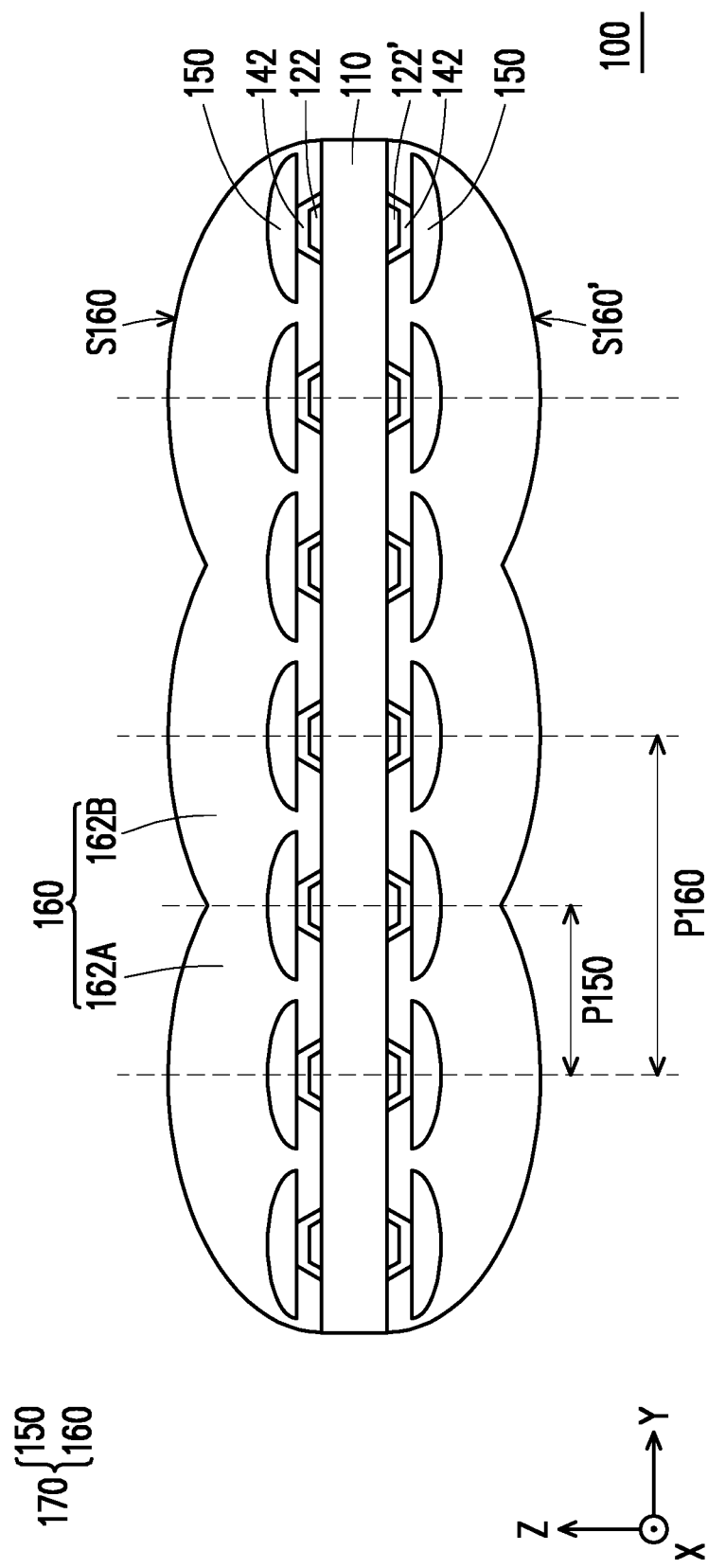
FIG. 22 is a schematic cross-sectional view of the electronic device in FIG. 16 along the extension line of the line VII-VII' according to some embodiments.

FIG. 22 is a schematic cross-sectional view of the electronic device in FIG. 16 along the extension line of the line VII-VII' according to some embodiments. In FIG. 22, the electronic device 100 includes the substrate 110, the first pad 122, the second pad 122', the edge wire 142, the first protection layers 150, and the second protection layer 160. The first protection layers 150 and the second protection layer 160 may form the protection structure 170. The second protection layer 160 may include the multiple first printed patterns 162A and the multiple second printed patterns 162B, and a spacing P160 between the first printed pattern 162A and the second printed pattern 162B may be greater than a spacing P150 between the first protection layers 150. For example, the spacing P160 in FIG. 22 may be twice of the spacing P150, but is not limited thereto A fabrication means of the second protection layer 160 in FIG. 22 may be roughly the same as the fabrication means of the second protection layer 160 in FIG. 20, and therefore, description is omitted. In other words, the second protection layer 160 may be fabricated on the substrate 110 by a multiple printing means. The multiple printing means may enable the printed patterns to partially overlap each other, which helps to determine the continuity of the second protection layer 160. Therefore, the second protection layer 160 may truly wrap around the edge wires 142 to provide an ideal protection and blocking function. For example, the second protection layer 160 may ensure that the edge wires 142 are not affected by external moisture and become degraded or oxidized.

In summary, the electronic device according to the embodiments of the disclosure has the edge wires disposed on the edge of the substrate, extending from the first surface of the substrate to the second surface while passing through the side surface of the substrate. The circuit structure intended to be bonded to the electronic device, such as a circuit board, may be bonded to the second surface of the electronic device. In this way, the periphery of the first surface of the electronic device does not need to reserve the bonding area for bonding to an external circuit structure and be capable of a narrow bezel width or even a design having no bezel. In addition, the edge wires are covered by the protection structure to ensure reliability of the edge wires. The protection structure may seal the edge wires to prevent external moisture from oxidizing or degrading the edge wires. Therefore, the electronic device has good quality.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A manufacturing method of an electronic device, comprising:
   forming a conductive material layer on a substrate, the conductive material layer continuously extends from a first surface of the substrate to a second surface while passing through a side surface, wherein the side surface connects the first surface and the second surface;
   forming a first protection layer on the conductive material layer and patterning the conductive material layer by using the first protection layer as a mask to form an edge wire, wherein the edge wire is retracted relative to the first protection layer and forms an undercut structure; and
   forming a second protection layer on the substrate, wherein the second protection layer fills the undercut structure.

2. The manufacturing method of the electronic device according to claim 1, wherein the first protection layer is formed on the conductive material layer by transfer printing.

3. The manufacturing method of the electronic device according to claim 1, further comprising:
   forming a driving circuit structure on the substrate and covering at least a portion of the driving circuit structure with a release protection layer before forming the conductive material layer.

4. The manufacturing method of the electronic device according to claim 3, further comprising:
   removing the release protection layer after the second protection layer is formed.

5. The manufacturing method of the electronic device according to claim 1, wherein the second protection layer is formed on the substrate by dipping, spraying, coating, or transfer printing.

6. The manufacturing method of the electronic device according to claim 1, wherein forming the second protection layer comprises performing a plurality of printing steps, and a plurality of transfer printing patterns of the plurality of printing steps at least partially overlap.

7. The manufacturing method of the electronic device according to claim 1, wherein patterning the conductive material layer comprises an isotropic etching method.

8. The manufacturing method of the electronic device according to claim 1, wherein an etchant for patterning the conductive material layer has selectivity with regards to the conductive material layer and the first protection layer.

* * * * *